US010403755B2

(12) United States Patent
Zeng et al.

(10) Patent No.: US 10,403,755 B2
(45) Date of Patent: Sep. 3, 2019

(54) THIN FILM TRANSISTOR AND METHOD FOR MANUFACTURING THE SAME

(71) Applicant: Shenzhen China Star Optoelectronics Technology Co., Ltd., Shenzhen, Guangdong (CN)

(72) Inventors: Mian Zeng, Guangdong (CN); Shu Jhih Chen, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 176 days.

(21) Appl. No.: 15/551,637

(22) PCT Filed: Jun. 7, 2017

(86) PCT No.: PCT/CN2017/087368

§ 371 (c)(1),
(2) Date: Aug. 17, 2017

(87) PCT Pub. No.: WO2018/209736

PCT Pub. Date: Nov. 22, 2018

(65) Prior Publication Data

US 2019/0123209 A1 Apr. 25, 2019

(30) Foreign Application Priority Data

May 19, 2017 (CN) .......................... 2017 1 0359347

(51) Int. Cl.
*H01L 29/786* (2006.01)
*H01L 29/66* (2006.01)
(Continued)

(52) U.S. Cl.
CPC .. *H01L 29/78618* (2013.01); *H01L 29/41733* (2013.01); *H01L 29/42384* (2013.01);
(Continued)

(58) Field of Classification Search
CPC ......... H01L 29/78633; H01L 29/78636; H01L 29/7869; H01L 27/1225; H01L 29/78618; H01L 29/41733; H01L 29/42384
(Continued)

(56) References Cited

U.S. PATENT DOCUMENTS 3,344,324 A * 9/1967 Beale ...................... H01L 21/00 257/286
3,700,976 A * 10/1972 Dill ........................ H01L 29/00 257/66
(Continued)

FOREIGN PATENT DOCUMENTS

CN 202142535 U 2/2012
CN 102437196 A 5/2012
(Continued)

*Primary Examiner* — Mary A Wilczewski

(57) ABSTRACT

Related to is the technical field of display panels, and in particular to a thin film transistor and a method for manufacturing the same. The thin film transistor provided on a substrate includes a drain, a source, a gate, and an active layer. The drain and the source are in a comb-like shape and are connected with the active layer through a first via hole and a second via hole, respectively. Such arrangement enables a width of a channel formed between the drain and the source to be increased and a layout scale of the thin film transistor to be reduced at the same time, whereby space is saved. When used in a GOA circuit or other circuits, the thin film transistor is helpful to achievement of a narrow-bezel design of a display panel.

12 Claims, 7 Drawing Sheets

(51) Int. Cl.
*H01L 29/417* (2006.01)
*H01L 29/423* (2006.01)

(52) U.S. Cl.
CPC .. *H01L 29/66742* (2013.01); *H01L 29/66969* (2013.01); *H01L 29/7869* (2013.01); *H01L 29/78633* (2013.01); *H01L 29/78696* (2013.01)

(58) Field of Classification Search
USPC .......................................................... 438/158
See application file for complete search history.

(56) References Cited

U.S. PATENT DOCUMENTS 4,462,041 A * 7/1984 Glenn ................. H01L 29/0692 257/401
4,665,374 A * 5/1987 Fathimulla ......... H03H 9/02566 257/254
RE33,829 E * 2/1992 Castleberry ........... G02F 1/1362 345/206
5,373,377 A * 12/1994 Ogawa ............. G02F 1/136204 257/356
6,348,808 B1 * 2/2002 Yakura .............. G01R 31/2628 324/750.3
6,362,509 B1 * 3/2002 Hart .................... H01L 27/0207 257/202
6,521,109 B1 * 2/2003 Bartic ................. G01N 27/414 204/403.01
6,545,291 B1 * 4/2003 Amundson ......... H01L 51/0021 257/20
7,316,944 B2 * 1/2008 Ahn .................... H01L 27/1255 257/E21.414
7,351,600 B2 * 4/2008 Yoo ................... G02F 1/134363 438/158
7,351,979 B2 * 4/2008 Klausmann ....... H01L 27/14632 250/370.01
8,698,150 B2 * 4/2014 Yang ................. H01L 29/41733 257/501
9,360,716 B2 * 6/2016 Ochiai .................... G02F 1/136
10,115,915 B1 * 10/2018 Wei ..................... H01L 51/0558
2002/0145144 A1 * 10/2002 Kane ..................... G02F 1/1368 257/72
2003/0060038 A1 * 3/2003 Sirringhaus ............ B82Y 30/00 438/637
2003/0141807 A1 * 7/2003 Kawase .............. H01L 27/3262 313/498
2003/0205662 A1 * 11/2003 Boer ................. H01L 27/14609 250/208.1
2004/0173795 A1 * 9/2004 Moon .............. H01L 29/41733 257/59
2004/0189919 A1 * 9/2004 Ahn .................. G02F 1/134363 349/141
2004/0235227 A1 * 11/2004 Kawase ................ G02F 1/1368 438/158
2004/0245519 A1 * 12/2004 Van De Walle ............................ H01L 29/41733 257/40
2005/0056847 A1 * 3/2005 Nakamura ............ H01L 27/016 257/72
2005/0151195 A1 * 7/2005 Kawase .................. C23C 18/31 257/347
2005/0173701 A1 * 8/2005 Kawase .............. H01L 51/0022 257/40
2005/0231656 A1 * 10/2005 den Boer .......... H01L 27/14609 349/42
2006/0033105 A1 * 2/2006 Fujii ..................... G02F 1/1368 257/66
2006/0146218 A1 * 7/2006 Her ....................... G02F 1/1368 349/43
2006/0240603 A1 * 10/2006 Mathea ............... H01L 27/1255 438/149
2006/0249817 A1 * 11/2006 Kawase .............. H01L 51/0022 257/622
2006/0281332 A1 * 12/2006 Duinveld .......... H01L 29/41758 438/780
2007/0145283 A1 * 6/2007 Klausmann ....... H01L 27/14632 250/370.11
2007/0145284 A1 * 6/2007 Klausmann ........... G01T 1/2018 250/370.11
2008/0024690 A1 * 1/2008 Hirakata ........... G02F 1/136259 349/54
2008/0203395 A1 * 8/2008 Chao ................ H01L 29/66757 257/72
2008/0231556 A1 * 9/2008 Kretz .................. G09G 3/3233 345/76
2008/0290339 A1 * 11/2008 Nakatani .............. H01L 27/283 257/40
2009/0166638 A1 * 7/2009 Honda ................. G09G 3/3233 257/71
2009/0284677 A1 * 11/2009 Shin ................. G02F 1/134363 349/46
2010/0301328 A1 * 12/2010 Yamazaki ........... H01L 29/4908 257/43
2010/0317160 A1 * 12/2010 Sambandan ........... B82Y 40/00 438/149
2011/0001736 A1 * 1/2011 Tanaka ................ H01L 27/1214 345/204
2011/0241006 A1 * 10/2011 Mitani ............. G02F 1/136209 257/59
2011/0297936 A1 * 12/2011 Makita ................ H01L 27/1214 257/53
2012/0096928 A1 * 4/2012 Occhipinti ......... G01N 27/4141 73/31.06
2012/0200546 A1 * 8/2012 Miyamoto ........ H01L 27/14623 345/205
2012/0292717 A1 * 11/2012 Gelinck ................ H01L 27/283 257/401
2012/0321785 A1 * 12/2012 Rogers .................. B82Y 10/00 427/249.1
2013/0001579 A1 * 1/2013 Jung ..................... H01L 27/088 257/72
2013/0015444 A1 * 1/2013 Hirai ..................... C23C 14/042 257/57
2013/0038518 A1 * 2/2013 Tagawa ................ H01L 27/124 345/92
2013/0039455 A1 * 2/2013 Horiuchi .............. G11C 19/184 377/54
2013/0228779 A1 * 9/2013 Lan .................. H01L 29/78603 257/49
2013/0252431 A1 9/2013 Chen et al.
2013/0328069 A1 * 12/2013 Yang ................ H01L 29/41733 257/88
2015/0028341 A1 * 1/2015 Sun .................. H01L 29/78633 257/72
2015/0035573 A1 * 2/2015 Koyama ................. H01L 21/00 327/143
2015/0268523 A1 * 9/2015 Ochiai .................... G02F 1/136 257/71
2016/0013209 A1 1/2016 Yang et al.
2016/0064412 A1 * 3/2016 Choi ..................... H01L 27/124 257/72
2016/0172389 A1 * 6/2016 Kao .................... H01L 29/7869 257/66
2016/0187695 A1 * 6/2016 Cho .................... G02F 1/13338 349/12
2016/0308153 A1 * 10/2016 Jongman ............... H01L 51/055
2016/0372487 A1 * 12/2016 Wang .................... H01L 29/786
2016/0379995 A1 * 12/2016 Deng .................... H01L 27/124 257/59
2017/0117196 A1 * 4/2017 Xu ...................... G02F 1/13306

(56) References Cited

U.S. PATENT DOCUMENTS

| | | | | |
|---|---|---|---|---|
| 2018/0047814 | A1* | 2/2018 | White | H01L 29/7781 |
| 2018/0219104 | A1 | 8/2018 | Gu et al. | |
| 2018/0350994 | A1* | 12/2018 | Hosaka | H01L 21/28 |

FOREIGN PATENT DOCUMENTS

| | | | | |
|---|---|---|---|---|
| CN | 106128944 | A | 11/2016 | |
| GB | 1396896 | * | 6/1975 | H01L 27/0716 |
| JP | 46-6271 | * | 5/1970 | |

* cited by examiner

THIN FILM TRANSISTOR AND METHOD FOR MANUFACTURING THE SAME

CROSS-REFERENCE TO RELATED APPLICATIONS

This application claims the priority of Chinese patent application CN 201710359347.9, entitled "Thin film transistor and method for manufacturing the same" and filed on May 19, 2017, the entirety of which is incorporated herein by reference.

FIELD OF THE INVENTION

The present disclosure relates to the technical field of display panels, and in particular, to a thin film transistor and a method for manufacturing the same.

BACKGROUND OF THE INVENTION

Thin film transistor (TFT) liquid crystal display (LCD) devices, as flat-panel display devices, are used increasingly in high-performance display applications due to their advantages such as small size, low power consumption, no radiation, and relatively low manufacturing cost. As display devices become bigger and bigger in size, it is required that display devices be manufactured with higher resolution and better high frequency driving performance. It is thus required that a TFT should have a high mobility and high performance. In order to improve electron mobility in a semiconductor active layer, the semiconductor active layer is usually made of a semiconductor oxide material (e.g., IGZO, Indium Gallium Zinc Oxide), whose electron mobility is dozens of times of that of an amorphous silicon layer. In prior arts, there are mainly two types of array substrates using IGZO as a semiconductor active layer: top gate IGZO TFT structure and etch stop layer (ESL) IGZO TFT structure.

FIG. 1*a* schematically shows structure of a top gate IGZO TFT in a prior art when it is viewed from a normal direction of a substrate. FIG. 1*b* schematically shows a cross-section of the top gate IGZO TFT in FIG. 1*a*. As shown in FIG. 1*a*, a gate 11 partially overlaps an IGZO active layer 12; a drain 13 and a source 14 also overlap the active layer 12; and the drain 13 and the source 14 are respectively provided on upper and lower sides of the gate 11 and are connected with the IGZO active layer 12 through a first via hole 15 and a second via hole 16. Because the gate 11 does not overlap the drain 13 and the source 14, a stray capacitance produced by the gate 11 is very small. For this reason, top gate IGZO TFT structures have wide applications in the technical field of display panels.

FIG. 2*a* schematically shows structure of an ESL IGZO TFT in a prior art when it is viewed from a normal direction of a substrate. FIG. 2*b* schematically shows a cross-section of the ESL IGZO TFT in FIG. 2*a*. As can be seen from FIGS. 2*a* and 2*b*, an IGZO active layer 22 is provided inside a gate 21; a drain 23 and a source 24 respectively overlap the IGZO active layer 22; and the drain 23 and the source 24 are provided respectively on upper and lower parts of the IGZO active layer 22 and are connected with the IGZO active layer 22 through a first via hole 25 and a second via hole 26. In the TFT structure, an etch stop layer 27 is configured to be a protective layer of the IGZO active layer, for protecting the IGZO active layer from a metal etching solution used in a subsequent procedure. The TFT structure has an excellent electrical property. Therefore, ESL IGZO TFT structures also have wide applications in the technical field of display panels.

Unfortunately, when a top gate IGZO TFT structure or an ESL IGZO TFT structure in the prior arts is used in a GOA circuit or in other circuits, a channel of the TFT has to be designed with a large width, as a consequence of which, the TFT occupies a large space, which is not conducive to a narrow-bezel design of a display panel.

SUMMARY OF THE INVENTION

The present disclosure provides a thin film transistor (TFT) and a method for manufacturing the same, so that when a TFT is designed with a wide channel and is used in a GOA circuit or other circuits, a large size of the TFT does not affect the narrow-bezel design of a display panel.

The TFT provided by the present disclosure is provided on a substrate. The TFT comprises a drain, a source, a gate, and an active layer. The drain is in a comb-like shape, and includes a plurality of parallelly arranged first teeth, and a first shaft that is arranged on ends of the first teeth and is configured to connect the first teeth to each other. The source is in a comb-like shape, and includes a plurality of parallelly arranged second teeth, and a second shaft that is arranged on ends of the second teeth and is configured to connect the second teeth to each other. The first teeth and the second teeth are arranged parallel to each other and are staggered, and the first shaft and the second shaft are arranged facing each other. The drain is connected with the active layer through a first via hole, and the source is connected with the active layer through a second via hole.

In the TFT according to the present disclosure, the drain and the source are in a comb-like shape and are arranged staggered, by way of which a width of a channel between the drain and the source is increased, and a layout scale of the TFT is reduced and space is thus saved. When used in a GOA circuit or other circuits, the TFT can help to achieve a narrow-bezel design of a display panel.

As a further improvement on the TFT, the active layer is made of indium gallium zinc oxide (IGZO) because IGZO has an electron mobility dozens of times that of an amorphous silicon layer. When IGZO is used as the active layer, the electron mobility in the active layer is greatly increased, and the resolution and the high frequency driving performance of the TFT are therefore improved. The TFT can thus be applied in a high performance and large size display device.

As a further improvement on the active layer, when viewed from a normal direction of the substrate, the active layer includes a first strip which overlaps a portion of each of the first teeth and a portion of each of the second teeth.

In the TFT with such a structure, a first via hole can be provided in each of overlapping regions of the first strip and the first teeth, and a second via hole can be provided in each of overlapping regions of the first strip and the second teeth. In this way, the first strip serves as a channel between the drain and the source. A width of the channel is distinctly increased, which is helpful in improving resolution and high frequency performance. The design of the active layer does not add to the entire size of the TFT, which helps to achieve narrow-bezel design of a display panel.

In order to further increase the width of the channel between the drain and the source without changing the overall size of the TFT, the active layer may further comprise a second strip connected with the first strip. A combination of the second strip and the first strip overlaps the source or the drain.

When the combination of the first strip and the second strip overlaps the source, both the second teeth and the second shaft of the source can be provided with the second via holes as required, so as to further increase the width of the channel between the source and the drain. When the combination of the first strip and the second strip overlaps the drain, both the first teeth and the first shaft of the drain can be provided with the first via holes as required, so as to further increase the width of the channel between the source and the drain.

As a further improvement on the active layer, the active layer further includes a third strip connected with the first strip. A combination of the third strip, the first strip, and the third strip overlaps the drain and the source. In this manner, both the first teeth and the first shaft of the drain can be provided with the first via holes, and both the second teeth and the second shaft of the source can be provided with the second via holes as required, so as to further increase the width of the channel between the source and the drain.

As a further improvement on the active layer, when the combination of the second strip and the first strip overlaps the source, the third strip overlaps the drain, and when the combination of the second strip and the first strip overlaps the drain, the third strip overlaps the source.

As a further improvement on gate of the TFT, the gate is in a wave shape and is arranged in a gap formed between the drain and the source. By doing this, a layout scale of the TFT is reduced, which is conducive to narrow-bezel design of a display panel.

As a further improvement on the gate, when viewed from the normal direction of the substrate, an orthographic projection of the active layer is located within an orthographic projection of the gate.

The present disclosure further provides a method for manufacturing the foresaid TFT. The method comprises the following steps.

In step S11, a metal light shielding layer is formed on a substrate.

In step S12, a buffer layer is formed on an entire surface of the substrate.

In step S13, an active layer is formed on the buffer layer.

In step S14, a gate insulator layer is formed on the active layer.

In step S15, a gate is formed on the gate insulator layer.

In step S16, an inter-layer dielectric layer is formed on the entire surface of the substrate, and a first via hole and a second via hole are formed on the inter-layer dielectric layer, the first via hole and the second via hole being configured to penetrate the inter-layer dielectric layer and expose the active layer.

In step S17, a drain and a source are formed on the inter-layer dielectric layer.

The drain is in a comb-like shape, and includes a plurality of parallelly arranged first teeth, and a first shaft that is arranged on ends of the first teeth and is configured to connect the first teeth to each other.

The source is in a comb-like shape, and includes a plurality of parallelly arranged second teeth, and a second shaft that is arranged on ends of the second teeth and is configured to connect the second teeth to each other.

The first teeth and the second teeth are arranged parallel to each other and are staggered, and the first shaft and the second shaft are arranged facing each other. The drain is connected with the active layer through the first via hole, and the source is connected with the active layer through the second via hole.

In step S18, a protective layer is formed on the entire surface of the substrate.

In the above step S15, when viewed from a normal direction of the substrate, the gate is in a wave shape and is arranged in a gap formed between the drain and the source.

In the above step S15, after the gate is formed, the active layer is enabled to conduct by a self-adjustment method.

The present disclosure further provides another method for manufacturing the foresaid TFT. The method comprises the following steps.

In step S21, a gate is formed on a substrate.

In step S22, a gate insulator layer is formed on an entire surface of the substrate.

In step S23, an active layer is formed on the gate insulator layer.

In step S24, an etch stop layer is formed on the entire surface of the substrate, and a first via hole and a second via hole are formed on the etch stop layer, the first via hole and the second via hole being configured to penetrate the etch stop layer and expose the active layer.

In step S25, a drain and a source are formed on the etch stop layer.

The drain is in a comb-like shape, and includes a plurality of parallelly arranged first teeth, and a first shaft that is arranged on ends of the first teeth and is configured to connect the first teeth to each other.

The source is in a comb-like shape, and includes a plurality of parallelly arranged second teeth, and a second shaft that is arranged on ends of the second teeth and is configured to connect the second teeth to each other.

The first teeth and the second teeth are arranged parallel to each other and are staggered, and the first shaft and the second shaft are arranged facing each other. The drain is connected with the active layer through the first via hole, and the source is connected with the active layer through the second via hole.

In step S26, a protective layer is formed on the entire surface of the substrate.

In the above step S23, viewed from the normal direction of the substrate, an orthographic projection of the active layer is located within an orthographic projection of the gate.

In the TFT according to the present disclosure, the drain and the source are in a comb-like shape and are arranged staggered, by way of which the width of the channel between the drain and the source is increased, and a layout scale of the TFT is reduced and space is thus saved. When used in a GOA circuit or other circuits, the TFT can help to achieve a narrow-bezel design of a display panel. In particular, when the active layer is made of IGZO, the electron mobility in the channel between the drain and the source becomes dozens of times that in an amorphous silicon layer. In this way, the resolution and the high frequency driving performance of the TFT are further improved.

BRIEF DESCRIPTION OF THE DRAWINGS

The present disclosure will be described in a more detailed way below in conjunction with the embodiments and the accompanying drawings, in which.

In the accompanying drawings, same components use same reference signs. The accompanying drawings are not drawn according to actual proportions.

DETAILED DESCRIPTION OF THE EMBODIMENTS

The present disclosure will be detailed below in conjunction with the drawings. Terms such as "upper", "lower", "left", and "right" used in the following text are to be considered as seen from the figures, and should not be considered as limiting the present disclosure.

Embodiment 1

Figure 1A:
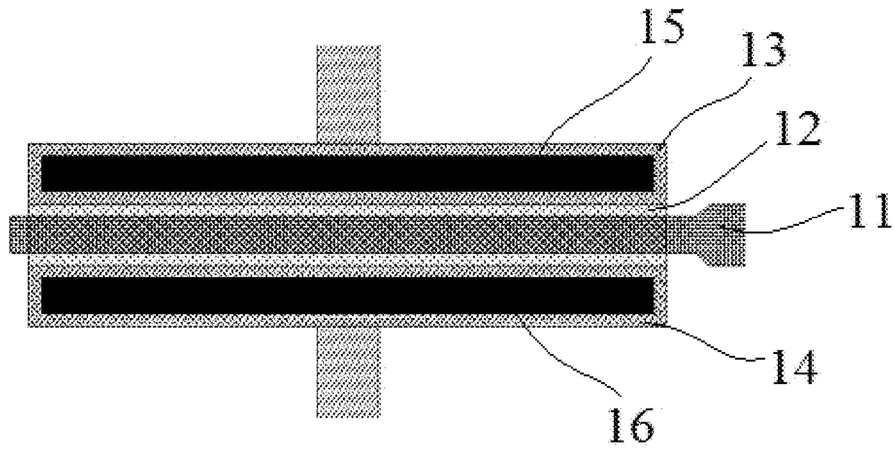
FIG. 1*a* schematically shows structure of a top gate IGZO TFT in a prior art when it is viewed from a normal direction of a substrate.
Figure 1B:
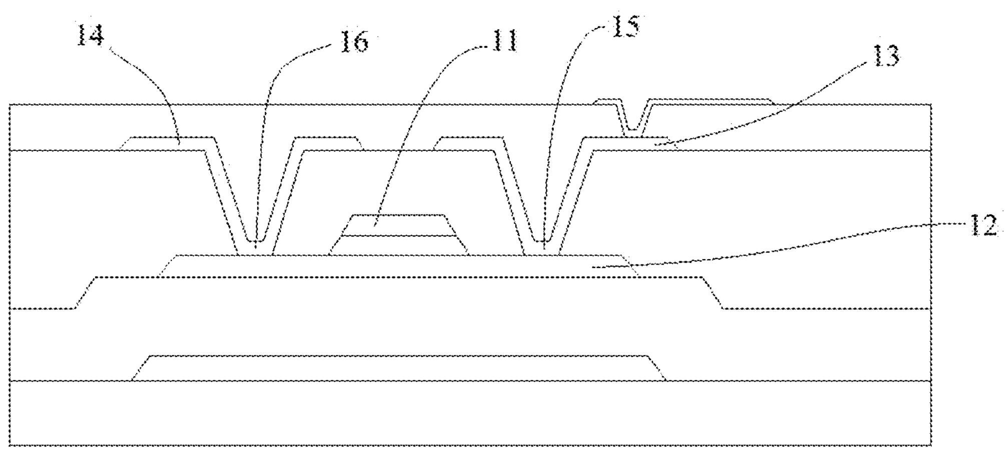
FIG. 1*b* schematically shows a cross-section of the top gate IGZO TFT in FIG. 1*a;*
Figure 2A:
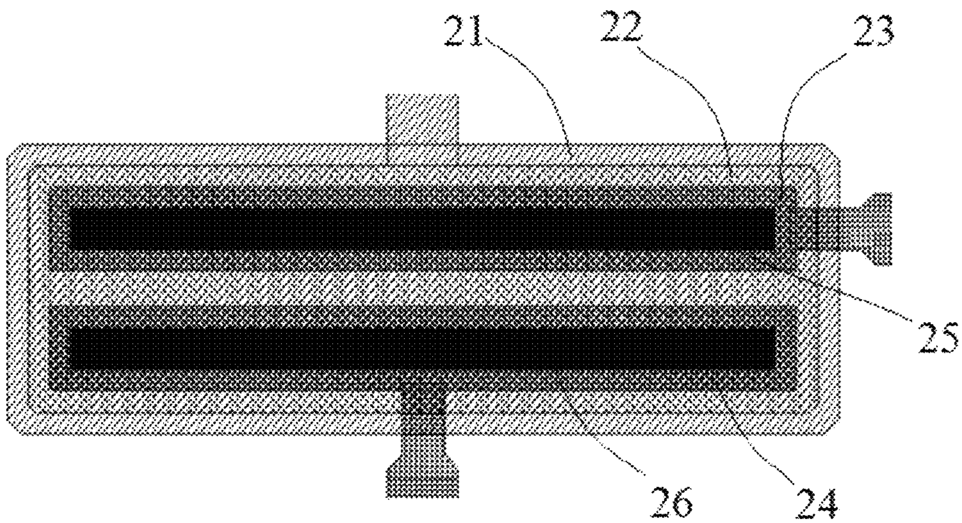
FIG. 2*a* schematically shows structure of an ESL IGZO TFT in a prior art when it is viewed from a normal direction of a substrate.
Figure 2B:
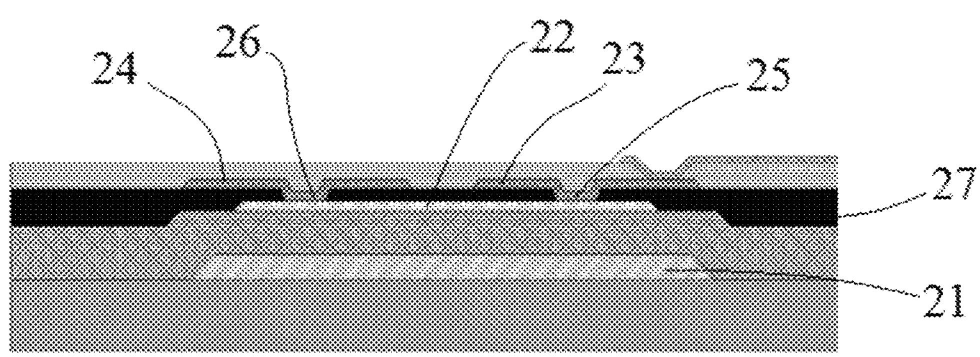
FIG. 2*b* schematically shows a cross-section of the ESL IGZO TFT in FIG. 2*a;*
Figure 3:
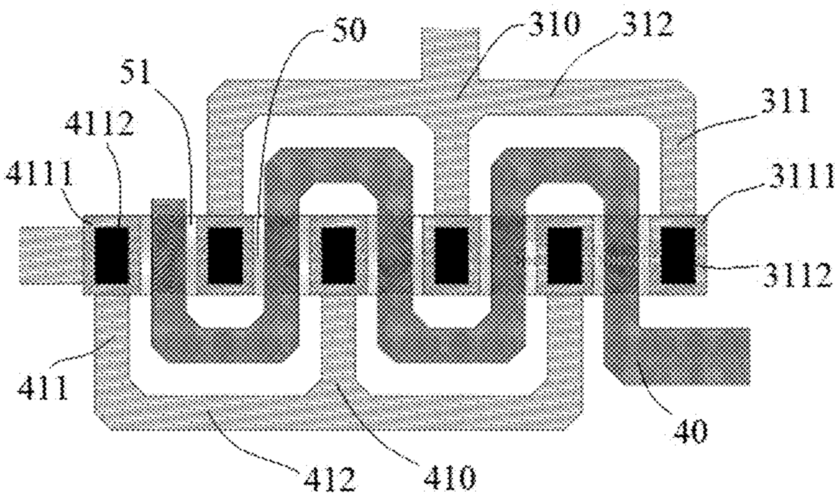
FIG. 3 schematically shows structure of a TFT of embodiment 1 when it is viewed from a normal direction of a substrate.

FIG. 3 schematically shows structure of a thin film transistor (TFT) of the present embodiment when it is viewed from a normal direction of a substrate. As can be seen from FIG. 3, a comb-like drain 310 includes a plurality of parallelly arranged first teeth 311, and a first shaft 312 that is arranged on upper ends of the first teeth 311 and is configured to connect the first teeth 311 to each other. A comb-like source 410 includes a plurality of parallelly arranged second teeth 411, and a second shaft 412 that is arranged on lower ends of the second teeth 411 and is configured to connect the second teeth 411 to each other. The first teeth 311 and the second teeth 411 are arranged parallel to each other and are staggered. The first shaft 312 and the second shaft 412 are arranged facing each other. Preferably, the first shaft 312 is arranged perpendicular to the first teeth 311, and the second shaft 412 is arranged perpendicular to the second teeth 411.

In FIG. 3, the first teeth 311 each include a first insertion portion 3111 that is configured to insert into the second teeth 411. Similarly, the second teeth 411 each include a second insertion portion 4111 that is configured to insert into the first teeth 311. An active layer 50 includes a first strip 51 that covers the first insertion portion 3111 and the second insertion portion 4111. That is, the first strip 51 overlaps a portion of each of the first teeth 311 and a portion of each of the second teeth 411. As shown in FIG. 3, lower ends of the first teeth 311 and upper ends of the second teeth 411 overlap the first strip 51. In other words, viewed from the normal direction of the substrate, the first strip has an orthographic projection in a rectangular shape, an upper side and a lower side of the rectangle being aligned with the upper ends of the second teeth 411 and the lower ends of the first teeth 311, respectively. In the structure shown in FIG. 3, the first insertion portions 3111 and the second insertion portions 4111 are respectively portions of the first teeth 311 and portions of the second teeth 411 that overlap the first strip 51.

Preferably, a gate 40 of the TFT is in a wave shape and is provided in a gap formed between the drain 310 and the source 410. In the present embodiment, since the first strip 51 is in a shape of a strip, the first strip 51 also partially overlaps the gate 40 provided in the gap formed between the drain 310 and the source 410. As shown in FIG. 3, the first strip 51 overlaps the gate 40 partially.

Preferably, in the present embodiment, in order to connect the drain 310 and the source 410 respectively with the active layer 50, each of the first insertion portions 3111 is provided with a first via hole 3112 for connecting the first insertion portion 3111 with the active layer 50, and each of the second insertion portions 4111 is provided with a second via hole 4112 for connecting the second insertion portion 4111 with the active layer 50. In this way, the drain 310 is connected with the first strip 51 of the active layer 50 through the first via holes 3112, and the source 410 is connected with the first strip 51 of the active layer 50 through the second via holes 4112.

In the TFT according to the present embodiment, the first teeth 311 and the second teeth 411 are staggered, by means of which a layout scale of the TFT is reduced and meanwhile a width of a channel between the drain and the source is increased, which is helpful to improve resolution and high frequency driving performance. When used in a GOA circuit or other circuits, the TFT can help to achieve a narrow-bezel design of a display panel.

Preferably, the active layer is made of indium gallium zinc oxide (IGZO) because IGZO has an electron mobility dozens of times that of an amorphous silicon layer. When IGZO is used as the active layer, the electron mobility in the active layer is greatly increased, and the resolution and the high frequency driving performance of the TFT are therefore improved. The TFT can thus be applied in a high performance and large size display device.

Embodiment 2

Figure 4:
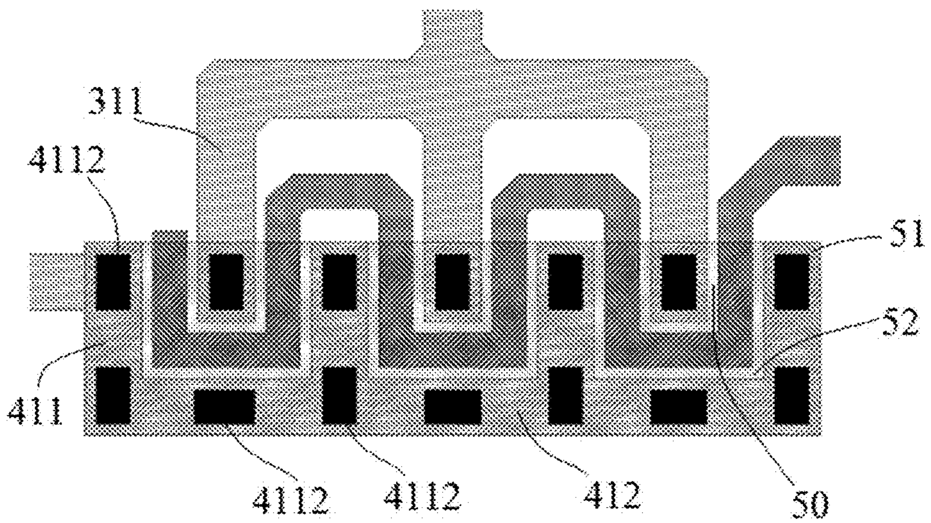
FIG. 4 schematically shows structure of a TFT of embodiment 2 when it is viewed from a normal direction of a substrate.

FIG. 4 schematically shows structure of a TFT of the present embodiment when it is viewed from a normal direction of a substrate. As can be seen from FIG. 4, different from the active layer in embodiment 1, an active layer 50 in the present embodiment comprises a first strip 51 and a second strip 52. The first strip 51 and the second strip 52 are connected to each other and can be configured in one piece. When the first strip 51 and the second strip 52 are in one piece, the active layer is simple in structure and is easy to produce. Of course, the first strip 51 and the second strip 52 overlap each other partially, but this does not affect the performance of the TFT. In the present disclosure, both the first strip 51 and the second strip 52 overlap a source or a drain. For ease of illustration, the first strip 51 and the second strip 52 are defined collectively as a combination, namely a combination of the second strip 52 and the first strip 51. As shown in FIG. 4, the combination of the second strip 52 and the first strip 51 overlap the source 410.

As shown in FIG. 4, the active layer 50 covers second teeth 411 and a second shaft 412 of the source. Therefore, both the second teeth 411 and the second shaft 412 can be provided therein with via holes 4112. In this way, a channel between first teeth 311 and the source is in a U shape, whereby a width of a channel between the drain and the source is increased, which is helpful for application of the TFT in a display device of high performance and large size.

Of course, in the present embodiment, the combination of the second strip 52 and the first strip 51 can also be configured to overlap the drain 310, by way of which a same technical effect can be achieved as long as both the first teeth 311 and the first shaft 312 of the drain 310 are provided therein with first via holes.

Embodiment 3

Figure 5:
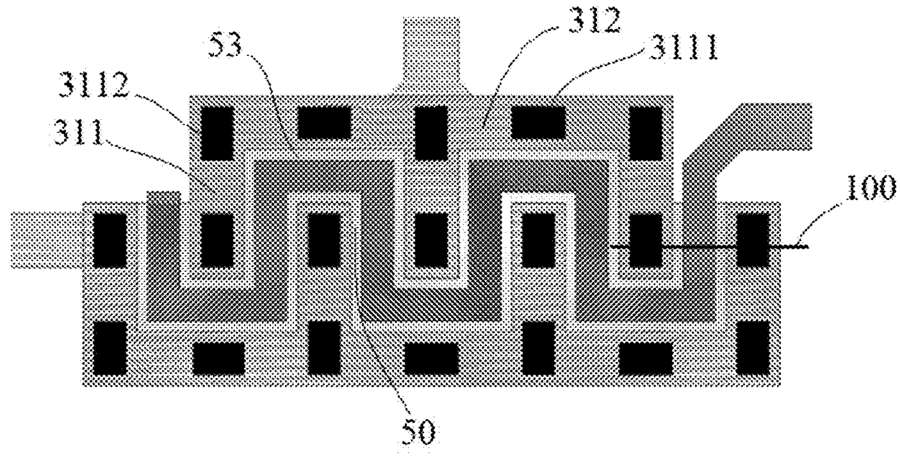
FIG. 5 schematically shows structure of a TFT of embodiment 3 when it is viewed from a normal direction of a substrate.

FIG. 5 schematically shows structure of a TFT of the present embodiment when it is viewed from a normal direction of a substrate. As can be seen from FIG. 5, different from the active layer in embodiment 2, an active layer 50 in the present embodiment further comprises a third strip 53. The third strip 53 and the first strip 51 are connected to each other. In one case, when a combination of a second strip 52 and the first strip 51 overlaps a source, the third strip 53 overlaps a drain; when the combination of the second strip 52 and the first strip 51 overlaps the drain, the third strip 53 overlaps the source; and there are of course also other situations. In the present disclosure, the first strip 51, the second strip 52, and the third strip 53 all overlap the source and the drain. For ease of illustration, the first strip 51, the second strip 52, and the third strip 53 are defined collectively as a combination, namely a combination of the third strip 53, the first strip 51, and the second strip 52. The combination of the third strip 53, the first strip 51, and the second strip 52 overlaps the drain 310 and the source 410. Here, the third strip 53 and the first strip 51 may partially overlap each other, but this does not affect the performance of the TFT. Of course, the third strip 53 and the first strip 51 can be configured in one piece. That is, the first strip 51, the second strip 52, and the third strip 53 can be configured to be an entire surface, which overlap the drain 310 and the source 410. When the first strip 51, the second strip 52, and the third strip 53 are configured in one piece, with the active layer designed as such, a width of a channel between the source and the drain is increased. Meanwhile the active layer designed as such is simple in structure and is easy to produce.

In the present disclosure, both first teeth 311 and a first shaft 312 of the drain 310 are provided therein with via holes 3112. Such arrangement enable the channel between the drain and the source to be in a wave shape, as a consequence of which, a size of the channel is further increased, and thus the performance of the TFT is further improved.

Embodiment 4

Figure 6:
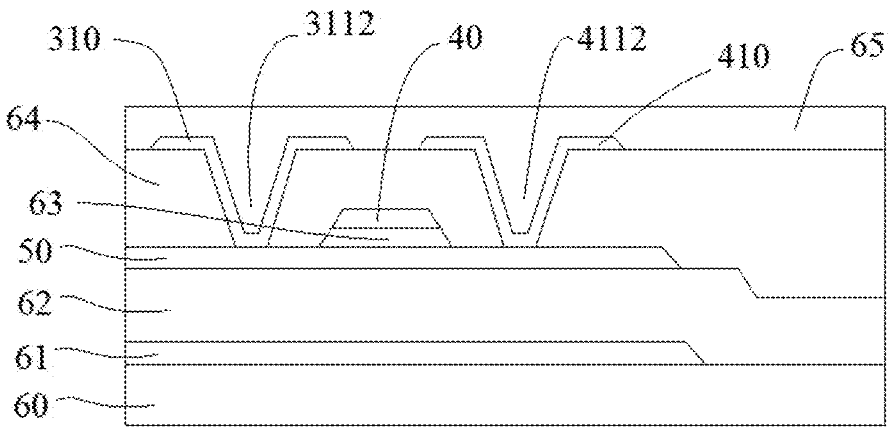
FIG. 6 schematically shows a cross-section of the TFT in FIG. 5 along line 100.

In the present embodiment, a method for manufacturing the TFTs according to embodiments 1 to 3 will be described in detail. FIG. 6 schematically shows a cross-section of the TFT in FIG. 5. The method comprises following steps.

In step S11, a metal film is deposited on an entire surface of a substrate 60. A metal used may be Mo, Ta, MoTa, Al, or others. A metal light shielding layer 61 is then formed by photo-etching. Preferably, the metal light shielding layer 61 has a thickness of about 100 nm.

In step S12, a buffer layer 62 is formed on the entire surface of the substrate 60 by chemical vapor deposition. Preferably, the buffer layer 62 is made of SiOx, and has a thickness of about 300 nm. The buffer layer 62 is used to provide a better interface for forming an active layer in a subsequent procedure.

In step S13, an active layer 50 is deposited on the buffer layer 62. Preferably, the active layer 50 is made of IGZO, and a pattern of the active layer 50 is formed by photo-etching. The active layer 50 has a thickness of about 60 nm.

In step S14, a gate insulator layer 63 is formed on the active layer 50. Preferably, the gate insulator layer 63 is made of SiOx, and has a thickness of about 150 nm.

In step S15, a gate 40 is formed on the gate insulator layer 63. Then, the active layer 50 is enabled to be conductive by a self-adjustment method. That is, the active layer 50 is enabled to conduct by a laser and by using the formed gate 40 as a mask.

In step S16, an inter-layer dielectric (ILD) layer 64 is formed on the entire surface of the substrate, and a via hole 3112 and a second via hole 4112 are formed in the inter-layer dielectric layer 64. The active layer 50 is exposed at the first via hole 3112 and the second via hole 4112. Preferably, the inter-layer dielectric layer 64 is made of SiOx, and has a thickness of about 400 nm.

In step S17, a drain 310 and a source 410 are formed on the inter-layer dielectric layer. The drain 310 is connected with the active layer 50 through the first via hole 3112, and the source 410 is connected with the active layer 50 through the second via hole 4112.

The drain 310 is in a comb-like shape, and includes a plurality of parallelly arranged first teeth 311, and a first shaft 312 that is arranged on ends of the first teeth 311 and is configured to connect the first teeth 311 to each other.

The source 410 is also in a comb-like shape, and includes a plurality of parallelly arranged second teeth 411, and a second shaft 412 that is arranged on ends of the second teeth 411 and is configured to connect the second teeth 411 to each other.

The first teeth 311 and the second teeth 411 are arranged parallel to each other and are staggered. The first shaft 312 and the second shaft 412 are arranged facing each other. The drain 310 is connected with the active layer 50 through the first via hole 3112 and the source 410 is connected with the active layer 50 through the second via hole 4112.

In step S18, a protective layer 65 is manufactured on the entire surface of the substrate. Preferably, the protective layer 65 is made of SiOx, and has a thickness of about 200 nm.

The active layer 50 includes a first strip 51, a second strip 52, and a third strip 53. The drain 310 comprises the first teeth 311 and the first shaft 312. The source 410 comprises the second teeth 411 and the second shaft 412.

Embodiment 5

Figure 7:
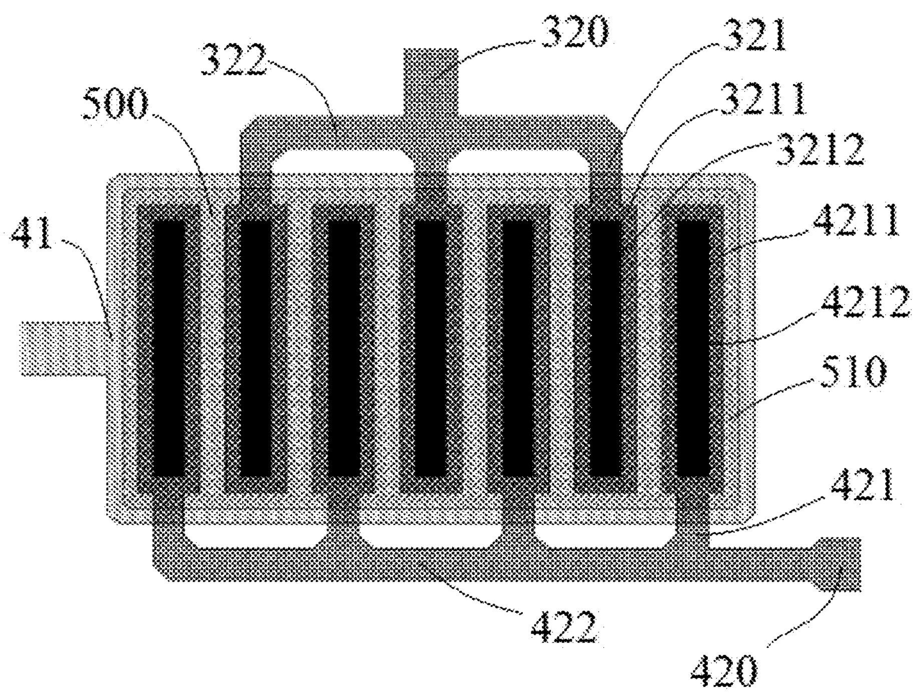
FIG. 7 schematically shows structure of a TFT of embodiment 5 when it is viewed from a normal direction of a substrate.

FIG. 7 schematically shows structure of a thin film transistor (TFT) of the present embodiment when it is viewed from a normal direction of a substrate. As can be seen from FIG. 7, a comb-like drain 320 includes a plurality of parallelly arranged first teeth 321, and a first shaft 322 that is arranged on upper ends of the first teeth 321 and is configured to connect the first teeth 321 to each other. A comb-like source 420 includes a plurality of parallelly arranged second teeth 421, and a second shaft 422 that is arranged on lower ends of the second teeth 421 and is configured to connect the second teeth 421 to each other. The first teeth 321 and the second teeth 421 are arranged parallel to each other and are staggered. The first shaft 322 and the second shaft 422 are arranged facing each other. Preferably, the first shaft 322 is arranged perpendicular to the first teeth 321, and the second shaft 422 is arranged perpendicular to the second teeth 421.

In FIG. 7, the first teeth 321 each include a first insertion portion 3211 that is configured to insert into the second teeth 421. Similarly, the second teeth 421 each include a second insertion portion 4211 that is configured to insert into the first teeth 321. An active layer 500 includes a first strip 510 that covers the first insertion portions 3211 and the second insertion portions 4211. That is, the first strip 510 overlaps a portion of each of the first teeth 311 and a portion of each of the second teeth 421. In the present embodiment, viewed from the normal direction of the substrate, the first strip 510 has an orthographic projection in a rectangular shape. As shown in FIG. 7, sides of the rectangle are beyond lower ends of the first teeth 321 and upper ends of the second teeth 421. In the structure shown in FIG. 7, the first insertion portions 3211 and the second insertion portions 4211 are respectively portions of the first teeth 321 and portions of the second teeth 421 that overlap the first strip 510.

In the present embodiment, viewed from the normal direction of the substrate, an orthographic projection of the active layer 500 is located in an orthographic projection of the gate 41. Therefore, the gate 41 also overlaps the first insertion portions 3211 and the second insertion portions 4211.

Preferably, in the present embodiment, in order to connect the drain 320 and the source 420 respectively with the active layer 50, each of the first insertion portions 3211 is provided with a first via hole 3212 for connecting the first insertion portions 3211 with the active layer 500, and each of the second insertion portions 4211 is provided with a second via hole 4212 for connecting the second insertion portions 4211 with the active layer 500. In this way, the drain 320 is connected with the first strip 510 of the active layer 500 through the first via holes 3212, and the source 420 is connected with the first strip 510 of the active layer 500 through the second via holes 4212.

In the TFT according to the present embodiment, the first teeth 321 and the second teeth 421 are arranged staggered, by means of which a layout scale of the TFT is reduced and meanwhile a width of a channel between the drain and the source is increased, which is helpful to improve the resolution and high frequency driving performance. When used in a GOA circuit or other circuits, the TFT can help to achieve a narrow-bezel design of a display panel.

Preferably, the active layer is made of indium gallium zinc oxide (IGZO) because IGZO has an electron mobility dozens of times that of an amorphous silicon layer. When IGZO is used as the active layer, the electron mobility in the active layer is greatly increased, and the resolution and high frequency driving performance of the TFT are therefore improved. The TFT can thus be applied in a high performance and large size display device.

Embodiment 6

Figure 8:
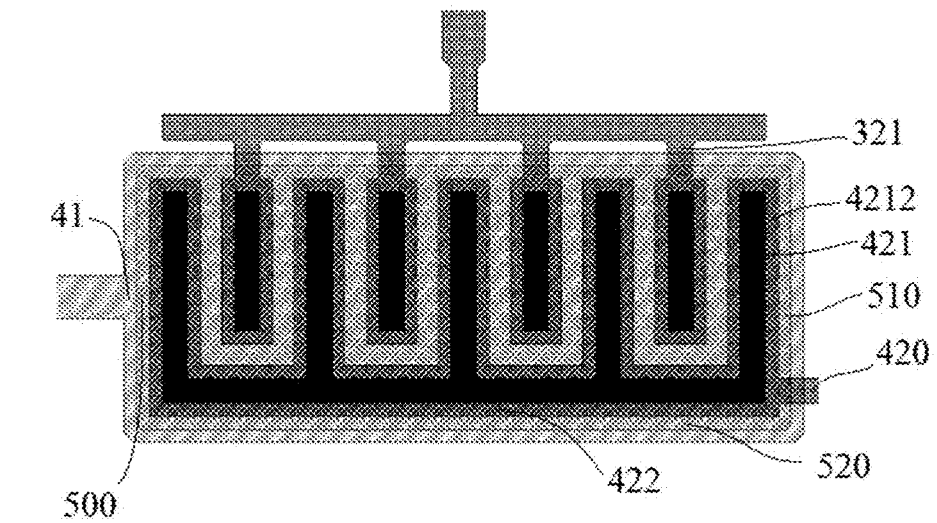
FIG. 8 schematically shows structure of a TFT of embodiment 6 when it is viewed from a normal direction of a substrate.

FIG. 8 schematically shows structure of a TFT of the present embodiment when it is viewed from a normal direction of a substrate. As can be seen from FIG. 8, different from the active layer in embodiment 5, an active layer 500 in the present embodiment comprises a first strip 510 and a second strip 520. The second strip 520 and the first strip 510 are connected to each other and can be configured in one piece. When the second strip 520 and the first strip 510 are in one piece, the active layer is simple in structure and is easy to produce. Of course, the first strip 510 and the second strip 520 may overlap each other partially, but this does not affect the performance of the TFT. In the present disclosure, both the first strip 510 and the second strip 520 overlap a source or a drain. For ease of illustration, the first strip 510 and the second strip 520 are defined collectively as a combination, namely a combination of the second strip 520 and the first strip 510. As shown in FIG. 8, the combination of the second strip 520 and the first strip 510 overlap the source 420. Similarly, in the present embodiment, when viewed from the normal direction of the substrate, an orthographic projection of the active layer 500 is located in an orthographic projection of the gate 41. Because the active layer 500 covers second teeth 421 and a second shaft 422 of the source 420, both the second teeth 421 and the second shaft 422 can be provided therein with via holes 4212. As shown in FIG. 8, in the present embodiment, the second via hole 4212 is provided along the second teeth 421 and the second shaft 422 of the source 420. In this way, a channel between first teeth 321 and the source 420 is in a U shape, whereby a width of the channel between the drain and the source is increased, which is helpful for application of the TFT in a display device of high performance and large size.

Of course, in the present embodiment, the combination of the second strip 520 and the first strip 510 can also be configured to overlap the drain 320, by way of which a same technical effect can be achieved as long as both the first teeth 321 and the first shaft 322 of the drain 320 are provided therein with first via holes 3212.

Embodiment 7

Figure 9:
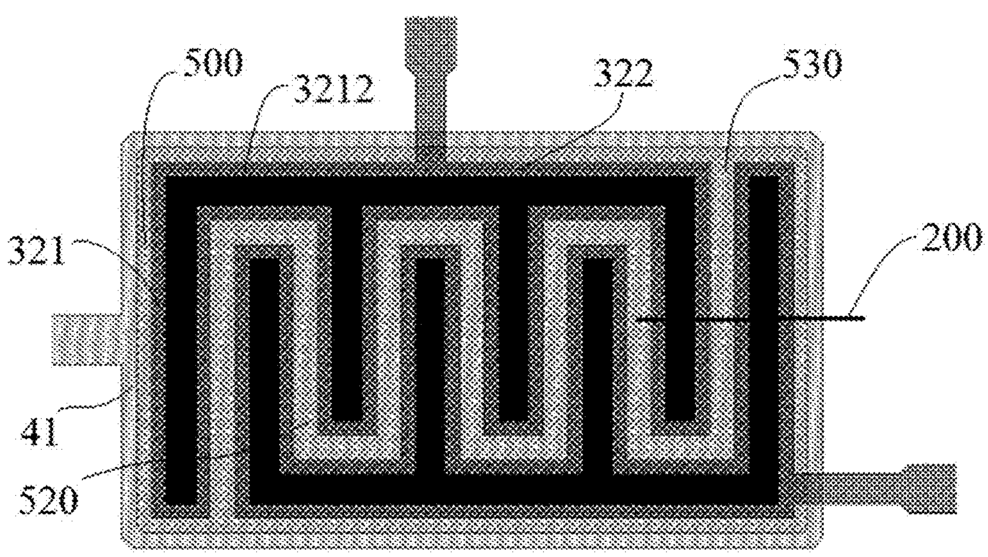
FIG. 9 schematically shows structure of a TFT of embodiment 7 when it is viewed from a normal direction of a substrate.

FIG. 9 schematically shows structure of a TFT of the present embodiment when it is viewed from a normal direction of a substrate. As can be seen from FIG. 9, different from the active layer in embodiment 6, an active layer 50 in the present embodiment further comprises a third strip 530. A first strip 510, a second strip 520, and the third strip 530 all overlap a source and a drain. In one case, when a combination of a second strip 520 and the first strip 510 overlaps the source, the third strip 530 overlaps the drain; when the combination of the second strip 520 and the first strip 510 overlaps the drain, the third strip 530 overlaps the source; and there are of course also other situations. For ease of illustration, the first strip 510, the second strip 520, and the third strip 530 are defined collectively as a combination, namely a combination of the third strip 530, the first strip 510, and the second strip 520. The combination of the third strip 530, the first strip 510, and the second strip 520 overlaps the drain and the source. Here, the third strip 530 and the first strip 510 may be configured in one piece, or may be configured to partially overlap each other, but this does not affect the performance of the TFT. When the first strip 510, the second strip 520, and the third strip 530 are configured in one piece, with the active layer designed as such, a width of a channel between the source and the drain is increased. Meanwhile the active layer designed as such is simple in structure and is easy to produce. Similarly, in the present embodiment, when viewed from the normal direction of the substrate, the active layer 500 has an orthographic projection located within an orthographic projection of a gate 41.

In the present disclosure, both first teeth 321 and a first shaft 322 of the drain are provided therein with first via holes 3112. The first via hole 3212 is provided along the second teeth 321 and the second shaft 322 of the source. Such arrangement enable the channel between the drain and the source to be in a wave shape, as a consequence of which, a size of the channel in further increased, and thus the performance of the TFT is further improved.

Embodiment 8

Figure 10:
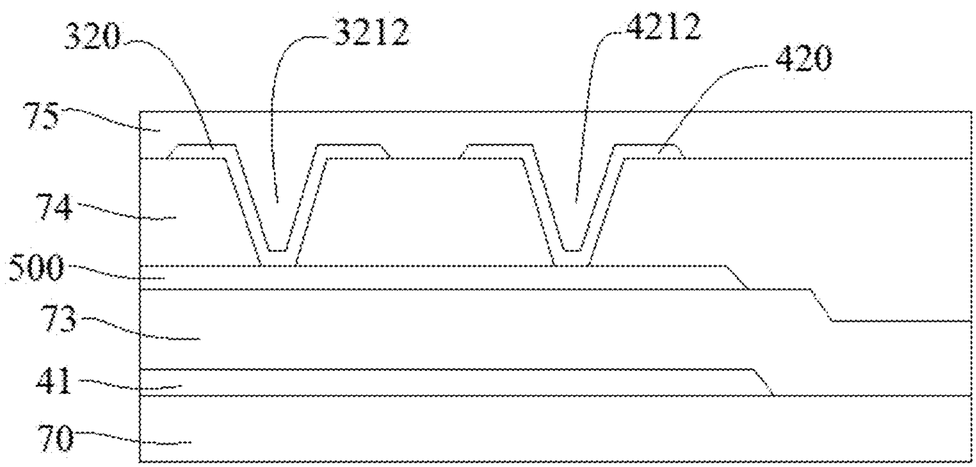
FIG. 10 schematically shows a cross-section of the TFT in FIG. 9 along line 200.

In the present embodiment, a method for manufacturing the TFTs according to embodiments 5 to 7 will be described in detail. FIG. 10 schematically shows a cross-section of the TFT in FIG. 9. The method comprises following steps.

In step S21, a gate 41 is formed on a substrate 70 by photo-etching. The gate 41 has a thickness of about 400 nm.

In step S22, a gate insulator layer 73 is formed on an entire surface of the substrate 70 by chemical vapor deposition. Preferably, the gate insulator layer 73 is made of SiOx, and has a thickness of about 450 nm.

In step S23, an active layer 500 is formed on the gate insulator layer 73. Preferably, the active layer 500 is made of IGZO, and a pattern of the active layer 500 is formed by photo-etching. The active layer 500 has a thickness of about 100 nm.

In step S24, an etch stop layer (ESL) 74 is formed on the entire surface of the substrate, for protecting the active layer 500 from a metal etching solution used in a subsequent procedure. Meanwhile, a first via hole 3212 and a second via hole 4212 are provided on the etch stop layer 74, for exposing the active layer 500. Preferably, the etch stop layer 74 is made of SiOx, and has a thickness of about 100 nm.

In step S25, a drain 320 and a source 420 are formed on the etch stop layer 74. The drain 320 is connected with the active layer 500 through the first via hole 3212, and the source 420 is connected with the active layer 500 through the second via hole 4212.

The drain 320 is in a comb-like shape, and includes a plurality of parallelly arranged first teeth 321, and a first shaft 322 that is arranged on ends of the first teeth 321 and is configured to connect the first teeth 321 to each other.

The source 420 is also in a comb-like shape, and includes a plurality of parallelly arranged second teeth 421, and a second shaft 422 that is arranged on ends of the second teeth 421 and is configured to connect the second teeth 421 to each other.

The first teeth 321 and the second teeth 421 are arranged parallel to each other and are staggered. The first shaft 322 and the second shaft 422 are arranged facing each other. The drain 320 is connected with the active layer 500 through the first via hole 3212 and the source 420 is connected with the active layer 500 through the second via hole 4212.

In step S26, a protective layer 75 is manufactured on the entire surface of the substrate. Preferably, the protective layer 75 is made of SiOx, and has a thickness of about 200 nm.

The active layer 500 includes a first strip 510, a second strip 520, and a third strip 530. The drain 320 comprises first teeth 321 and a first shaft 322. The source 420 comprises second teeth 421 and a second shaft 422.

The above embodiments are provided only for illustrating the technical solutions of the present disclosure, and should not be construed as limitations of the present disclosure. Although the present disclosure is described in detail in connection with preferred embodiments, one can make any variations or replacements on and to the technical solutions of the present disclosure. In particular, as long as there is no structural conflict, any technical features of any of the embodiments may be combined with one another, and the technical solutions formed therefrom, without departing from the spirit and scope of the technical solutions of the present disclosure, shall fall within the protection scope of the claims.

The invention claimed is:

1. A thin film transistor, provided on a substrate and comprising a drain, a source, a gate, and an active layer, wherein the drain is in a comb-like shape, and comprises a plurality of parallelly arranged first teeth, and a first shaft that is arranged on ends of the first teeth and is configured to connect the first teeth to each other, wherein the source is in a comb-like shape, and comprises a plurality of parallelly arranged second teeth, and a second shaft that is arranged on ends of the second teeth and is configured to connect the second teeth to each other, wherein the first teeth and the second teeth are arranged parallel to each other and are staggered, and the first shaft and the second shaft are arranged facing each other, and wherein the drain is connected with the active layer through a first via hole, and the source is connected with the active layer through a second via hole;

wherein viewed from a normal direction of the substrate, the gate is in a wave shape and is arranged in a gap formed between the drain and the source.

2. The thin film transistor according to claim 1, wherein viewed from a normal direction of the substrate, an orthographic projection of the active layer is located within an orthographic projection of the gate.

3. The thin film transistor according to claim 1, wherein viewed from a normal direction of the substrate, the active layer includes a first strip, a projection of a portion of each of the first teeth and a projection of a portion of each of the second teeth along the normal direction are located within the first strip.

4. The thin film transistor according to claim 3, wherein viewed from the normal direction of the substrate, an orthographic projection of the active layer is located within an orthographic projection of the gate.

5. The thin film transistor according to claim 3, wherein the active layer further comprises a second strip connected with the first strip, a projection of the source or the drain along the normal direction is located within a combination of the second strip and the first strip.

6. The thin film transistor according to claim 5, wherein viewed from the normal direction of the substrate, an orthographic projection of the active layer is located within an orthographic projection of the gate.

7. The thin film transistor according to claim 5, wherein the active layer further comprises a third strip connected with the first strip, and a projection of the source and a projection of the drain along the normal direction are located within a combination of the third strip, the first strip, and the second strip.

8. The thin film transistor according to claim 7, wherein viewed from the normal direction of the substrate, an orthographic projection of the active layer is located within an orthographic projection of the gate.

9. The thin film transistor according to claim 7, wherein when the projection of the source along the normal direction is located within the combination of the second strip and the first strip, the projection of the drain along the normal direction is located within the third strip overlaps the drain, and when the projection of the drain along the normal direction is located within the combination of the second strip and the first strip, the projection of the source along the normal direction is located within the third strip.

10. The thin film transistor according to claim 9, wherein viewed from the normal direction of the substrate, an orthographic projection of the active layer is located within an orthographic projection of the gate.

11. A method for manufacturing a thin film transistor, comprising:

step S11: forming a metal light shielding layer on a substrate, step S12: forming a buffer layer on an entire surface of the substrate, step S13: forming an active layer on the buffer layer, step S14: forming a gate insulator layer on the active layer, step S15: forming a gate on the gate insulator layer, step S16: forming an inter-layer dielectric layer on the entire surface of the substrate, and meanwhile forming a first via hole and a second via hole on the inter-layer dielectric layer, the first via hole and the second via hole being configured to penetrate the inter-layer dielectric layer and expose the active layer, step S17: forming a drain and a source on the inter-layer dielectric layer, wherein the drain is in a comb-like shape, and includes a plurality of parallelly arranged first teeth, and a first shaft that is arranged on ends of the first teeth and is configured to connect the first teeth to each other, wherein the source is in a comb-like shape, and includes a plurality of parallelly arranged second teeth, and a second shaft that is arranged on ends of the second teeth and is configured to connect the second teeth to each other, and wherein the first teeth and the second teeth are arranged parallel to each other and are staggered, and the first shaft and the second shaft are arranged facing each other, and wherein the drain is connected with the active layer through the first via hole, and the source is connected with the active layer through the second via hole, and step S18: forming a protective layer on the entire surface of the substrate;

wherein viewed from a normal direction of the substrate, the gate is in a wave shape and is arranged in a gap formed between the drain and the source.

12. A method for manufacturing a thin film transistor, comprising:

step S21: forming a gate on a substrate, step S22: forming a gate insulator layer on an entire surface of the substrate, step S23: forming an active layer on the gate insulator layer, step S24: forming an etch stop layer on the entire surface of the substrate, and meanwhile forming a first via hole and a second via hole on the etch stop layer, the first via hole and the second via hole being configured to penetrate the etch stop layer and expose the active layer, step S25: forming a drain and a source on the etch stop layer, wherein the drain is in a comb-like shape, and includes a plurality of parallelly arranged first teeth, and a first shaft that is arranged on ends of the first teeth and is configured to connect the first teeth to each other, wherein the source is in a comb-like shape, and includes a plurality of parallelly arranged second teeth, and a second shaft that is arranged on ends of the second teeth and is configured to connect the second teeth to each other, and wherein the first teeth and the second teeth are arranged parallel to each other and are staggered, and the first shaft and the second shaft are arranged facing each other, and wherein the drain is connected with the active layer through the first via hole, and the source is connected with the active layer through the second via hole, and step S26: forming a protective layer on the entire surface of the substrate;

wherein viewed from a normal direction of the substrate, the gate is in a wave shape and is arranged in a gap formed between the drain and the source.

* * * * *